(12) United States Patent
Mueller et al.

(10) Patent No.: US 6,763,044 B2
(45) Date of Patent: Jul. 13, 2004

(54) TUNING A LASER

(75) Inventors: Emmerich Mueller, Aidlingen (DE); Ralf Haeussler, Gaertringen (DE); Wolf Steffens, Herrenberg (DE); Ulrich Kallmann, Tuebingen (DE)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/159,312

(22) Filed: May 31, 2002

(65) Prior Publication Data

US 2003/0048816 A1 Mar. 13, 2003

(30) Foreign Application Priority Data

Sep. 7, 2001 (EP) .......................................... 01121408

(51) Int. Cl.⁷ .............................................. H01S 5/10
(52) U.S. Cl. ........................... 372/20; 372/92; 372/102
(58) Field of Search ............................ 372/20, 92, 102

(56) References Cited

U.S. PATENT DOCUMENTS

| | | | |
|---|---|---|---|
| 5,319,668 A | 6/1994 | Luecke | 372/107 |
| 5,548,609 A | 8/1996 | Kitamura | 372/92 |
| 5,862,162 A | 1/1999 | Maeda | 372/20 |
| 5,867,512 A | 2/1999 | Sacher | 372/20 |
| 6,026,100 A * | 2/2000 | Maeda | 372/20 |
| 6,141,360 A * | 10/2000 | Kinnugawa et al. | 372/20 |
| 6,304,586 B1 | 10/2001 | Pease et al. | 372/38.02 |
| 6,404,798 B1 * | 6/2002 | Leckel et al. | 372/108 |
| 6,597,710 B2 * | 7/2003 | Vilhelmsson et al. | 372/20 |

FOREIGN PATENT DOCUMENTS

| | | |
|---|---|---|
| EP | 0 687 045 A2 | 12/1995 |
| JP | 08097516 | 12/1996 |
| JP | 11163469 | 6/1999 |

OTHER PUBLICATIONS

Claessen, L., Examiner. European Search Report, application No. EP 01 12 1408, dated Mar. 27, 2002.
Zhang, G. Z. and K. Hakuta. "Scanning Geometry for Broadly Tunable Single–Mode Pulsed Dye Lasers," Optics Letters, Washington, D.C. vol. 17, No. 14, XP000288960, Jul. 15, 1992, pp. 997–999.

* cited by examiner

*Primary Examiner*—James W. Davie

(57) ABSTRACT

The invention relates to a method of tuning a laser, comprising the steps of: providing a laser beam to an external cavity, the laser beam traveling through material along a path between a cavity end element and a tuning element, the path having an optical path length, selecting at least one mode of the laser by introducing a dispersion element in the path of the laser, rotating the tuning element about a pivot axis theoretically defined by the intersection of the surface planes of the cavity end element, the dispersion element and the tuning element to tune the laser, changing the optical path length of the path in order to at least partly compensate a shift between the real position of the pivot axis and the theoretically defined position.

39 Claims, 3 Drawing Sheets

TUNING A LASER

BACKGROUND OF THE INVENTION

The present invention relates to tuning a laser. In the optical communication industry there is a need for testing optical components and amplifiers with lasers that can be tuned continuously without mode hopping. To perform these tests Littman cavities can be used as external cavities to allow single-mode tuning of the laser. The geometry of these cavities is known, see e.g.: Liu and Littman, "Novel geometry for single-mode scanning of tunable lasers", Optical Society of America, 1981, which article is incorporated herein by reference. The advantage of the Littman cavity is that it is possible to tune the wavelength and the optical length of the cavity at the same time by changing only one parameter of the geometry, i.e. the tuning element.

The Littman geometry, however, is extremely sensible to deviations of the real geometry with respect to the perfect Littman configuration. This does impose severe requirements on the rotation mount for the tuning element of the Littman cavity. Smallest errors in the positioning of the pivot axis of the tuning element reduce the mode hop free tuning range of the cavity heavily. This requires costly precision when manufacturing and maintaining such tunable lasers.

The same shortcomings appear when tuning a laser within an external cavity with a shape of a so-called Littrow geometry. The Littrow geometry is disclosed for example in EP 0 952 643 A2, which document is incorporated herein by reference. In this document some disadvantages of mechanical backlash when using a prior art motor to drive the tuning elements of Littrow or Littman cavities are overcome by using laminated type piezo-electric elements for driving the tuning elements. However, it is clear that these laminated type piezo-electric elements also show deviations in their real geometry with respect to the perfect Littrow or Littman configuration.

SUMMARY OF THE INVENTION

Therefore, it is an object of the invention to provide improved tuning of a laser. The object is solved by the independent claims.

Due to deviations of real geometry with respect to perfect configuration and/or chromatic dispersion of the necessary optical components, a pivot point can generally only be found for a limited wavelength range. According to the present invention, dynamic corrections are made to account e.g. for such changed conditions. Preferred embodiments may even allow to provide mode hop free tuning for an extended wavelength range.

An advantage of preferred embodiments of the present invention is the provision of a tunable laser which autonomously and easily compensates for deviations of the real position of the pivot axis of the tuning element in a Littman configuration with respect to the theoretical perfect position of the pivot axis. Tuning of a laser according to preferred embodiments of the present invention avoids the above mentioned problems and provides a tunable laser with a wide mode hop free tuning range without heavy duties to the precision when manufacturing and maintaining such laser.

In the same way preferred embodiments of the present invention are capable to overcome deviations of the real position of the rotation axis of the tuning element of a Littrow configuration with respect to the theoretical perfect position of the rotation axis of the tuning element of the Littrow configuration.

These compensations according to preferred embodiments of the present invention are in both cases sufficient to provide continuous single-mode tuning within a predetermined tuning range of the tuning element.

According to preferred embodiments of the invention the correction can be realized by changing the optical path length of the path in the cavity by such a predetermined quantity to at least partly compensate a shift between the real position of the pivot or rotation axis and the theoretically defined position of this axis.

In preferred embodiments, this can be done simultaneously with the rotation of the tuning element.

In another preferred embodiments the change of the optical path length of the path can be realized by moving the dispersion element, the tuning element and/or the cavity end element by shifting it along a predetermined path by a predetermined distance.

Yet another embodiments of the invention can realize the change of the optical path length of the path by introducing additional material in the path, the material having a refractive index distinct from a refractive index of the path adjacent the additional material. It is further preferred that the refractive index of the material in the path and/or the additional material in the path is voltage-, magnetism-, pressure-, humidity- and/or temperature-sensitive, preferably by using as the material a liquid crystal, and that the apparatus comprises means for changing the voltage, the magnetism, the pressure, the humidity and/or the temperature applied to the material in the path and/or the additional material in the path.

In preferred embodiments of the inventive apparatus to perform inventive method the shifting or material-introducing element of the apparatus can be driven by a piezo-electric translocating element which can precisely shift the pivot or rotation axis of the respective tuning element of the laser or can precisely introduce the additional material in the cavity.

Other preferred embodiments are shown by the dependent claims.

It is clear that the invention can be partly embodied or supported by one or more suitable software programs, which can be stored on or otherwise provided by any kind of data carrier, and which might be executed in or by any suitable data processing unit.

BRIEF DESCRIPTION OF THE DRAWINGS

Other objects and many of the attendant advantages of the present invention will be readily appreciated and become better understood by reference to the following detailed description when considering in connection with the accompanied drawings. The components in the drawings are not necessarily to scale, emphasis instead being placed upon clearly illustrating the principles of the present invention. Features that are substantially or functionally equal or similar will be referred to with the same reference sign(s).

DETAILED DESCRIPTION OF THE INVENTION

Figure 1:
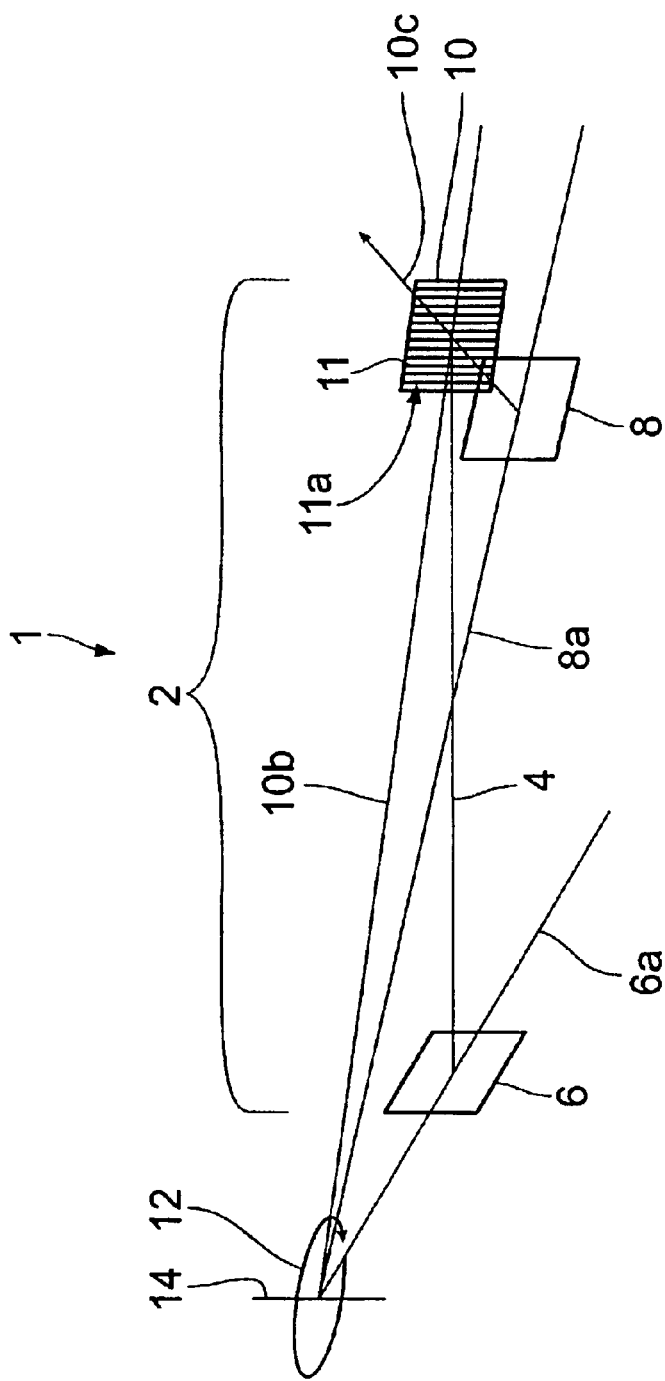
FIGS. 1–3 show schematic views of embodiments of the apparatus of the present invention.

Referring now in greater detail to the drawings, FIG. 1 shows a schematic view of a first embodiment 1 of the apparatus of the present invention. The apparatus 1 of FIG. 1 comprises an external cavity 2 in which laser light provided by an active medium (not shown), e.g. a laser diode, can resonate to provide a laser beam 4. The beam 4 travels in the cavity 2 along a path between a cavity end element 6 and a tuning element 8 of the external cavity 2. The cavity end element 6 and the tuning element 8 both providing a high reflective mirror.

The apparatus 1 further comprises a dispersion element 10 introduced in the path of the beam 4 for selecting at least one, preferably a longitudinal, mode of the laser. The dispersion element comprises a grating 11 having rules 11a.

The tuning element 8 can be rotated by an actuator (not shown) according to arrow 12 about a pivot axis 14 to tune the laser. The pivot axis 14 is theoretically defined by the intersection of the surface plane (indicated by line 6a) of the cavity end element 6, the surface plane (indicated by line 10b) of the dispersion element 10 and the surface plane (indicated by line 8a) of the tuning element 8.

The dispersion element 10 is mounted on one end of an electrically driven bimorph type piezo-electric element (not shown) which serves as the moving element of the invention. One end of the bimorph type piezo-electric element is freely slewable whereas the other end of the bimorph type piezo-electric element is fixed relative to the cavity 2.

The bimorph type piezo-electric element allows to move the dispersion element 10 corresponding, preferably simultaneously with the rotation of the tuning element 8 to compensate a shift between the real position of the pivot axis 14 and the theoretically defined position. This is done preferably by moving the dispersion element 10 along such a predetermined path that the compensation is sufficient to provide continuous single-mode tuning within a predetermined tuning range of the tuning element 8.

By moving the dispersion element 10 along the predetermined path the grating 11 is linearly moved along the axis 10c which is perpendicular to the grating 11 and lies in the plane of the axis 10b and 8a. The linear move of the grating 11 compensates the shift between the real position of the pivot axis 14 and the theoretically defined position. The linear moving of the dispersion element 10 has to be done along such a predetermined length of the path that the compensation is sufficient to provide continuous single-mode tuning within a predetermined tuning range of the tuning element 8 (for the evaluation of the predetermined length see below).

The apparatus 1 of FIG. 1 also comprises as a measuring device a wire strain gauge (not shown) for measuring the length of the move of the dispersion element 10 along axis 10c and to output a measured value of the length, a comparator (not shown) connected with the wire strain gauge for comparing the measured value of the length with the predetermined value of the length and to output a signal indicating a difference between the measured value and the predetermined value of the length, a controller (not shown) connected with the output of the comparator and with the moving element for adjusting the length of the move when the comparator has detected a difference between the measured value and the predetermined value.

For the above mentioned evaluation of the predetermined value of the length of the move of the dispersion element 10 the following steps can be performed: step a: substantially detecting mode or wavelength hops during rotation of the tuning element 8 about axis 14, step b: rotating the tuning element 8 about a predetermined angle 12 about axis 14 until at least one mode or wavelength hop substantially has occurred, step c: moving the dispersion element 10 along an arbitrary length along axis 10c, step d: rotating back the tuning element 8 about axis 14 about the predetermined angle 12 of step a, and repeating steps a to d with increasing or decreasing moving length along axis 10c of step c until substantially no mode or wavelength hops during rotation of the tuning element 8 are detected in step b, and using the overall moving length of step c per rotating angle 12 of step b to evaluate an approximation of the function which determines the moving length along axis 10c of the dispersion element 10 per rotating angle 12 of the tuning element 8. The approximation can be done by known approximation methods. The more repeats of steps a to d are performed the more exact is the predetermination. An alternative way to determine the value of the length of the move can be as follows: For a fixed angle 12 of the tuning element the dispersion element 10 is moved along axis 10, while the output power of the laser is monitored. An ideally positioned dispersion element 10c will produce a maximum of the laser output power. This procedure is repeated for different angles 12. The difference in the ideal positions of dispersion element 10 for different angles 12 then gives the desired value of the length of the move.

It is clear that the positioning of the axes 14, 6a, 8a, 10b, 10c according to FIG. 1 only show the ideal case of the positioning of the axes 14, 6a, 8a, 10b, 10c. The axes 14, 6a, 8a, 10b, 10c however can be positioned in another way, i.e. in other angles or positions as shown in FIG. 1, e.g. in other angles relative to the cavity end element 6, the tuning element 8 and/or the dispersion element 10. Moreover, the axes 14, 6a, 8a, 10b, 10c can be combined with each other. Furthermore, an equivalent way to change the optical path length is to move the tuning element 8 on a path perpendicular to axis 8a.

Additionally, it is possible to have variations in the position of the axes 14, 6a, 8a, 10b, 10c during the movement along axis 10c. E.g., these variations can be caused by the piezo-electric element or rotation stage for rotating the cavity end element 6, the tuning element 8 or the movement of the dispersion element 10. However, these variations can be corrected by calibrating the inventive apparatus 1.

Figure 2:
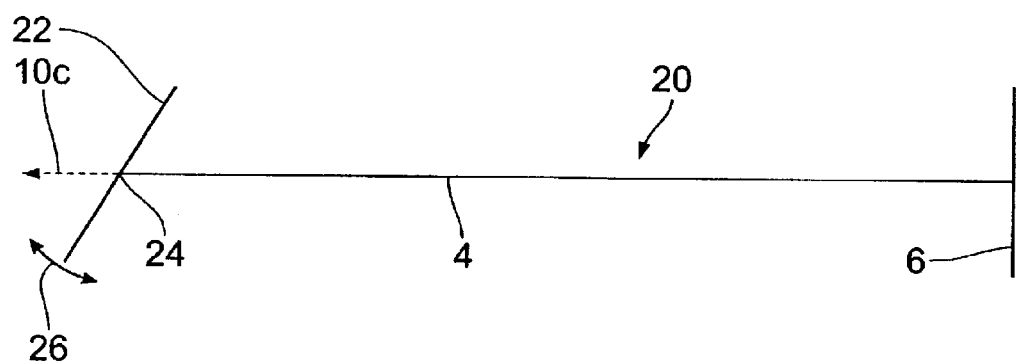

FIG. 2 shows a schematic view of a second embodiment 20 of the apparatus of the present invention. The second embodiment 20 comprises a combined dispersion and tuning element 22 instead of distinct dispersion and tuning elements 10 and 8. The combined dispersion and tuning element 22 can be rotated about a rotation axis 24 by an actuator (not shown) according to arrow 26 to tune the laser, the rotation axis 24 theoretically defined by the intersection of the laser beam axis 4 with the surface plane of the combined dispersion and tuning element 22.

The combined dispersion and tuning element 22 can be linearly moved along axis 10c to compensate a shift between a real position of the rotation axis 24 and a theoretically defined position of the rotation axis 24. The linear moving of the combined dispersion and tuning element 22 has to be done along such a predetermined length of a path that the compensation is sufficient to provide continuous single-mode tuning within a predetermined tuning range of the combined dispersion and tuning element 22 to evaluate the predetermined length of the move of the combined dispersion and tuning element 22 to make this compensation. The evaluation steps described above with respect to embodiment 1 can be performed with embodiment 20, similarly.

In the same way as apparatus 1 of FIG. 1 embodiment 20 of FIG. 2 also comprises as a measuring device a wire-strain gauge (not shown) for measuring the length of the move of the combined dispersion and tuning element 22 along axis 10c and to output a measured value of the length, a comparator (not shown) connected with the wire-strain gauge for comparing the measured value of the length with the predetermined value of the length and to output a signal indicating a difference between the measured value and the predetermined value of the length, a controller (not shown) connected with the output of the comparator and with the moving element for adjusting the length of the move when the comparator has detected a difference between the measured value and the predetermined value. Moreover, possible variations in the position of axis 24 during the movement of the combined dispersion and tuning element 22 along axis 10c can be corrected by calibrating the inventive apparatus of embodiment 20.

Figure 3:
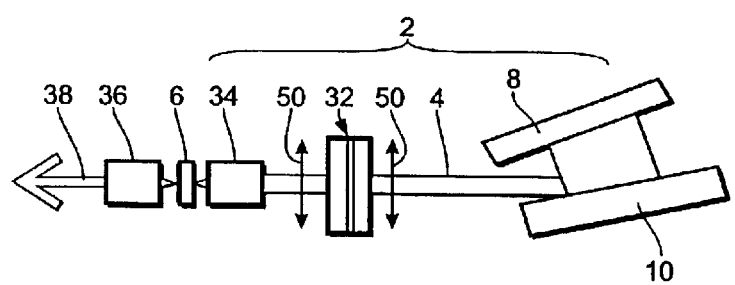

FIG. 3 shows a schematic view of a third embodiment 30 of the present invention. The general setup of embodiment 30 is similar to embodiment 1 of FIG. 1. However, in the path 4 of the laser beam there is introduced additional material 32. The additional material 32 serves to change the optical length of the path 4 to at least partly compensate a shift between the real position of the rotation axis 14 (see FIG. 1) and the theoretically defined position (be aware that FIG. 3 is only a schematic illustration not to scale, therefore axis 14 is not shown). The general function of embodiment 30 is the same as of embodiment 1 of FIG. 1, as well as the evaluation of the linear move of dispersion element 10 along axis 10c and the calibration step. Furthermore, in FIG. 3 there are shown two collimators 34 and 36 to provide collimated laser light within the laser cavity (collimator 34) and to collimate the laser light 38 leaving the cavity end element 6 (collimator 36). Additional material 32 is shown in further detail in FIG. 4.

Figure 4:
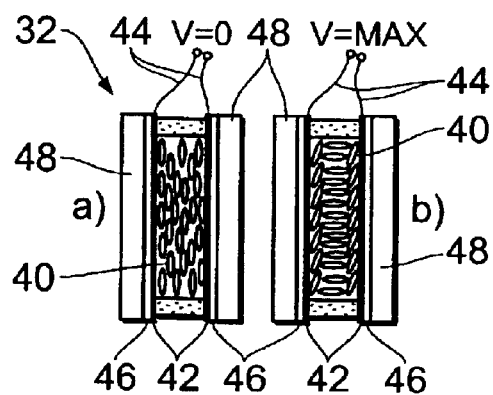
FIG. 4 shows the additional material of FIG. 3 in greater detail.

An example of a refractive index changing material is shown in FIG. 4. Here the additional material 32 is a so-called nematic LC (liquid crystal) retarder that provides phase shifts up to several pi. A phase shift of one pi corresponds to 1 mode spacing in cavity 2 with liquid crystal molecules 40. The liquid crystal molecules 40 are confined by two electrodes, here indium tin oxide (ITO) layers 46. The ITO layers 46 are contacted by wires 44 to receive a potential V. Part a) of FIG. 4 shows a situation with V=0. In this case, the liquid crystal molecules 40 are aligned parallel to each other. This alignment is induced by layers 42 located on layers 46. Layers 42 and 46 are supported by glass substrate layers 48. All layers 42, 46 and 48 are transparent for the laser light of light beam 4. However, liquid crystal molecules 40 in the additional material 32 provide phase retardation to the laser light of light beam 4. This phase retardation is maximum with V=0 as shown in part a) of FIG. 4.

When V is at its maximum the phase retardation is at its minimum as shown in part b) of FIG. 4. In this case, the liquid crystal molecules 40 are only partly aligned to each other.

Additional material 32 does not change the state of polarization of light beam 4 as indicated by arrows 50 in FIG. 3.

Figure 5:
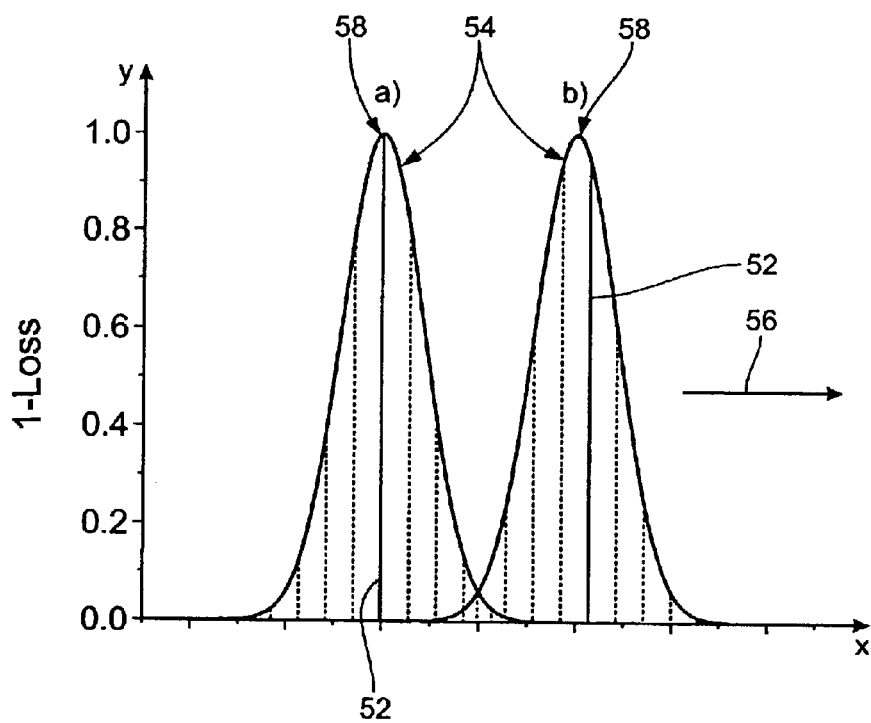
FIG. 5 shows graphs illustrating an advantage of the present invention.

FIG. 5 shows a graph that serves to illustrate the problem underlying the present invention. The graph of FIG. 5 shows the different tuning speed for a lasing mode 52 and the respective spectral filter curves 54. As schematically illustrating by the graph of FIG. 5 the lasing mode or lasing cavity mode 52 is shifted along the x-axis as indicated by arrow 56 when tuning the wavelength of the laser. However, as outlined above it can happen that the lasing mode 52 is shifted away from the center peak 58 of the spectral filter curve 54 when tuning the laser. This can be seen by the different position of the lasing mode 52 in the left curve a) of FIG. 5 and in the right curve b). In the right curve b) of FIG. 5, the lasing mode is shifted away from the center peak 58 of the spectral filter curve 54. This shift can be caused for example by a deviation of the real position of the pivot axes 14 or 24 from the theoretically defined position of these axes. The present invention compensates this shift so that with the invention it is always possible to keep the lasing mode 52 in the spectral filter curve 54 at the position of the center peak 58. Therefore, with the inventive method and apparatus now mode hopping occurs when tuning the laser.

What is claimed is:

1. A method of tuning a laser comprising:
   providing a laser beam to an external cavity, said laser beam traveling through a material being along a path between a cavity end element and a tuning element, said path having an optical path length;
   selecting at least one mode of the laser by introducing a dispersion element in said path of the laser;
   rotating said tuning element about a pivot axis being theoretically defined by an intersection of surface planes of said cavity end element, said dispersion element and said tuning element to tune the laser; and
   changing said optical path length of said path to at least partly compensate a shift between a real position of said pivot axis and a theoretically defined position.

2. The method of claim 1, further comprising the step of:
   changing the optical path length of the path simultaneously with the rotation of the tuning element and/or the combined dispersion and tuning element.

3. The method of claim 1, further comprising the steps of:
   changing the optical path length of the path by moving the dispersion element and/or the tuning element and/or the cavity end element and/or the combined dispersion and tuning element by shifting it along a predetermined path by a predetermined distance.

4. The method of claim 3, in which the predetermined path is a linear path.

5. The method of claim 1, further comprising the step of:
   changing the optical path length of the path by introducing additional material in the path, the additional material having a refractive index distinct from a refractive index of the material in the path adjacent the additional material in the path.

6. The method of claim 5, further comprising the step of changing the optical path length of the path by changing the quantity of the introduced additional material.

7. The method of claim 6, further comprising the step of changing the quantity of introduced additional material by moving an optical wedge of the material relative to the path.

8. The method of claim 1, further comprising the step of changing the refractive index of the material in the path and/or the introduced additional material in the path.

9. The method of claim 1, further comprising the steps of:
   changing the optical path length of the path by using as the material and/or as the additional material any material having a voltage-, magnetism-, pressure-, humidity- and/or temperature-sensitive refractive index, preferably by using as the material a liquid crystal,
   changing the refractive index of the material and/or the additional material by changing the voltage, magnetism, pressure, humidity and/or temperature applied to the material and/or to the additional material.

10. The method of claim 1, further comprising the steps of:
 at least approximately evaluating a function which determines the quantity of change of the optical path length for generating mode or wavelength hop free rotating of the tuning element within a predetermined tuning range of the tuning element as a function of the rotation angle of the tuning element, by:
 (a) substantially detecting mode or wavelength hops during rotation of the tuning element,
 (b) rotating the tuning element about an predetermined angle until at least one mode or wavelength hop has substantially occurred,
 (c) changing the optical path length by an arbitrary quantity,
 (d) rotating back the tuning element about the predetermined angle of step,
 repeating steps to with increasing or decreasing quantity of change of step until substantially no mode or wavelength hops during rotation of the tuning element are detected in step,
 using the quantity of change of step per rotating angle of step to evaluate an approximation of the function that determines the quantity of change of the optical path length per rotating angle of the tuning element.

11. The method of claim 10, further comprising the step of changing the optical path length according to the approximation function before or while rotating the tuning element.

12. The method of claim 1, further comprising the steps of:
 measuring the quantity of change of the change of the optical path length,
 comparing the measured value with the predetermined value, adjusting the quantity of change when detecting a difference between the measured value and the predetermined value.

13. The method of claim 1, further comprising the step of modulating the change of the optical path length of the path.

14. A method of tuning a laser comprising:
 providing a laser beam to an external cavity, said laser beam traveling through a material along a path between a cavity end element and a combined dispersion and tuning element, said path having an optical path length;
 selecting at least one mode of the laser by using a dispersion characteristic;
 rotating said combined dispersion and tuning element about a rotation axis being theoretically defined by an intersection of a laser beam axis with a surface plane of said combined dispersion and tuning element and shifting said combined dispersion and tuning element along said laser beam axis to tune the laser;
 changing said optical path length of said path to at least partly compensate a shift between a real position of said rotation axis and a theoretically defined position.

15. The method of claim 14, further comprising the step of:
 changing the optical path length of the path simultaneously with the rotation of the tuning element and/or the combined dispersion and tuning element.

16. The method of claim 14, further comprising the steps of:
 changing the optical path length of the path by moving the dispersion element and/or the tuning element and/or the cavity end element and/or the combined dispersion and tuning element by shifting it along a predetermined path by a predetermined distance.

17. The method of claim 16, in which the predetermined path is a linear path.

18. The method of claim 14, further comprising the step of:
 changing the optical path length of the path by introducing additional material in the path, the additional material having a refractive index distinct from a refractive index of the material in the path adjacent the additional material in the path.

19. The method of claim 18, further comprising the step of changing the optical path length of the path by changing the quantity of the introduced additional material.

20. The method of claim 19, further comprising the step of changing the quantity of introduced additional material by moving an optical wedge of the material relative to the path.

21. The method of claim 14, further comprising the step of changing the refractive index of the material in the path and/or the introduced additional material in the path.

22. The method of claim 14, further comprising the steps of:
 changing the optical path length of the path by using as the material and/or as the additional material any material having a voltage-, magnetism-, pressure-, humidity- and/or temperature-sensitive refractive index, preferably by using as the material a liquid crystal,
 changing the refractive index of the material and/or the additional material by changing the voltage, magnetism, pressure, humidity and/or temperature applied to the material and/or to the additional material.

23. The method of claim 14, further comprising the steps of:
 at least approximately evaluating a function which determines the quantity of change of the optical path length for generating mode or wavelength hop free rotating of the tuning element within a predetermined tuning range of the tuning element as a function of the rotation angle of the tuning element, by:
 (a) substantially detecting mode or wavelength hops during rotation of the tuning element,
 (b) rotating the tuning element about an predetermined angle until at least one mode or wavelength hop has substantially occurred,
 (c) changing the optical path length by an arbitrary quantity,
 (d) rotating back the tuning element about the predetermined angle of step,
 repeating steps to with increasing or decreasing quantity of change of step until substantially no mode or wavelength hops during rotation of the tuning element are detected in step,
 using the quantity of change of step per rotating angle of step to evaluate an approximation of the function that determines the quantity of change of the optical path length per rotating angle of the tuning element.

24. The method of claim 23, further comprising the step of changing the optical path length according to the approximation function before or while rotating the tuning element.

25. The method of claim 14, further comprising the steps of:
 measuring the quantity of change of the change of the optical path length,
 comparing the measured value with the predetermined value, adjusting the quantity of change when detecting a difference between the measured value and the predetermined value.

26. The method of claim 14, further comprising the step of modulating the change of the optical path length of the path.

27. A recording medium with which a program for tuning a laser has been recorded, said program comprising:

program instructions for providing a laser beam to an external cavity, said laser beam traveling through a material being along a path between a cavity end element and a tuning element, said path having an optical path length;

program instructions for selecting at least one mode of the laser by introducing a dispersion element in said path of the laser;

program instructions for rotating said tuning element about a pivot axis being theoretically defined by an intersection of surface planes of said cavity end element, said dispersion element and said tuning element to tune the laser; and program instructions for changing said optical path length of said path to at least partly compensate a shift between a real position of said pivot axis and a theoretically defined position.

28. A recording medium with which a program for tuning a laser has been recorded, said program comprising:

program instructions for providing a laser beam to an external cavity, said laser beam traveling through a material along a path between a cavity end element and a combined dispersion and tuning element, said path having an optical path length;

program instructions for selecting at least one mode of the laser by using a dispersion characteristic;

program instructions for rotating said combined dispersion and tuning element about a rotation axis being theoretically defined by an intersection of a laser beam axis with a surface plane of said combined dispersion and tuning element and shifting said combined dispersion and tuning element along said laser beam axis to tune the laser;

program instructions for changing said optical path length of said path to at least partly compensate a shift between a real position of said rotation axis and a theoretically defined position.

29. An apparatus for tuning a laser comprising:

an external cavity for receiving a laser beam, said laser beam traveling through a material being along a path between a cavity end element and a tuning element, said path having an optical path length;

a dispersion element being introduced in said path of the laser for selecting at least one mode of the laser;

a pivot axis being theoretically defined by an intersection of surface planes of said cavity end element, said dispersion element and said tuning element about which pivot axis said tuning element can be rotated to tune the laser;

a changing element for changing said optical path length of said path to at least partly compensate a shift between a real position of said pivot axis and a theoretically defined position.

30. The apparatus of claim 29, wherein the changing element is capable of changing the optical path length simultaneously with the rotation of the tuning element.

31. The apparatus of claim 29, wherein the changing element comprises a moving element for moving the dispersion element and/or the tuning element and/or the cavity end element and/or the combined dispersion and tuning element by shifting it along a predetermined path by a predetermined distance.

32. The apparatus of claim 31, wherein the predetermined path is a linear path.

33. The apparatus of claim 29, wherein the changing element comprises an introducing element comprising additional material to be introduced in the path, the additional material having a refractive index distinct from a refractive index of the material in the path adjacent the additional material in the path.

34. The apparatus of claim 33, wherein the additional material to be introduced has at least partly the shape of a wedge.

35. The apparatus of claim 29, wherein the changing element comprises a piezo-electric translocating element.

36. The apparatus of claim 29, wherein the refractive index of the material in the path and/or the refractive index of the additional material in the path is changeable.

37. The apparatus of claim 29, wherein:

the refractive index of the material in the path and/or the additional material in the path is voltage-, magnetism-, pressure-, humidity- and/or temperature-sensitive, preferably by using as the material a liquid crystal, and the apparatus comprises means for changing the voltage, the magnetism, the pressure, the humidity and/or the temperature applied to the material in the path and/or the additional material in the path.

38. The apparatus of claim 29, further comprising:

a wire strain gauge for measuring the quantity of the change of the optical path length of the path, a comparator connected with the wire strain gauge for comparing the measured value of the quantity with the predetermined quantity, a controller connected with the moving element for adjusting the rotating angle when the comparator has detected a difference between the measured value and the predetermined value.

39. An apparatus for tuning a laser comprising:

an external cavity for receiving a laser beam, said laser beam traveling through a material being along a path between a cavity end element and a tuning element, said path having an optical path length;

a combined dispersion and tuning element being introduced in the path of the laser for selecting a mode of the laser by a dispersion characteristic of said combined dispersion and tuning element;

a rotation axis being theoretically defined by an intersection of a laser light axis with a surface plane of said combined dispersion and tuning element about which rotation axis said combined dispersion and tuning element can be rotated to tune the laser; and a changing element for changing said optical path length of said path to at least partly compensate a shift between a real position of said rotation axis and a theoretically defined position.

* * * * *